United States Patent
Chen et al.

(10) Patent No.: US 6,841,266 B2
(45) Date of Patent: Jan. 11, 2005

(54) PHOTOSENSITIVE INSULATING FILM OF ORGANIC LIGHT EMITTING DIODE (OLED)

(75) Inventors: Man-Lin Chen, Mieo-Li Hsien (TW); Hsien-Kuang Lin, Hsin-Chu (TW); Pa-Yen Lu, Tao-Yuan Hsien (TW); Wen-Kuo Weng, Taipei Hsien (TW); Chun-Neng Ku, Hsin-Chu (TW)

(73) Assignee: Industrial Technology Research Institute, Hsin-Chu Hsien (TW)

( * ) Notice: Subject to any disclaimer, the term of this patent is extended or adjusted under 35 U.S.C. 154(b) by 52 days.

(21) Appl. No.: 10/092,427

(22) Filed: Mar. 8, 2002

(65) Prior Publication Data

US 2003/0170493 A1 Sep. 11, 2003

(51) Int. Cl.[7] .............................................. H05B 33/00
(52) U.S. Cl. .................. 428/690; 428/156; 428/167; 428/332; 428/917; 313/505; 313/509
(58) Field of Search ................. 428/156, 167, 428/332, 690, 917; 313/505, 506, 509; 427/66; 430/311

(56) References Cited

U.S. PATENT DOCUMENTS

| | | | | |
|---|---|---|---|---|
| 5,658,697 A | * | 8/1997 | Lin | 430/7 |
| 5,876,899 A | * | 3/1999 | Szmanda et al. | 430/270.1 |
| 5,994,836 A | * | 11/1999 | Boer et al. | 313/504 |
| 6,222,315 B1 | * | 4/2001 | Yoshizawa et al. | 313/509 |
| 6,580,212 B2 | * | 6/2003 | Friend | 313/504 |
| 2002/0003402 A1 | * | 1/2002 | Yamaguchi et al. | 313/504 |

* cited by examiner

Primary Examiner—Dawn Garrett
(74) Attorney, Agent, or Firm—Bacon & Thomas

(57) ABSTRACT

Fabrication device of organic light emitting diode (OLED) includes a Substrate, a transparent conductive layer, an insulating film layer, an organic light-emitting layer, and a conductive layer; when a suitable potential is applied thereto, an organic light-emitting layer emits a visible light, however, it usually occurs breakdown between cathode and anode or bad signal, therefore, the present invention provides a positive insulating film photoresist with an easily inclining obtuse angle, smooth surface, and easily controlled fabrication condition to cover the edge of a transparent electrode (anode) in order to avoid that when the edge of ITO transparent electrode is sharp it causes an organic light-emitting layer film breakdown and results from signal lost or weaken to increase the yields.

9 Claims, 4 Drawing Sheets

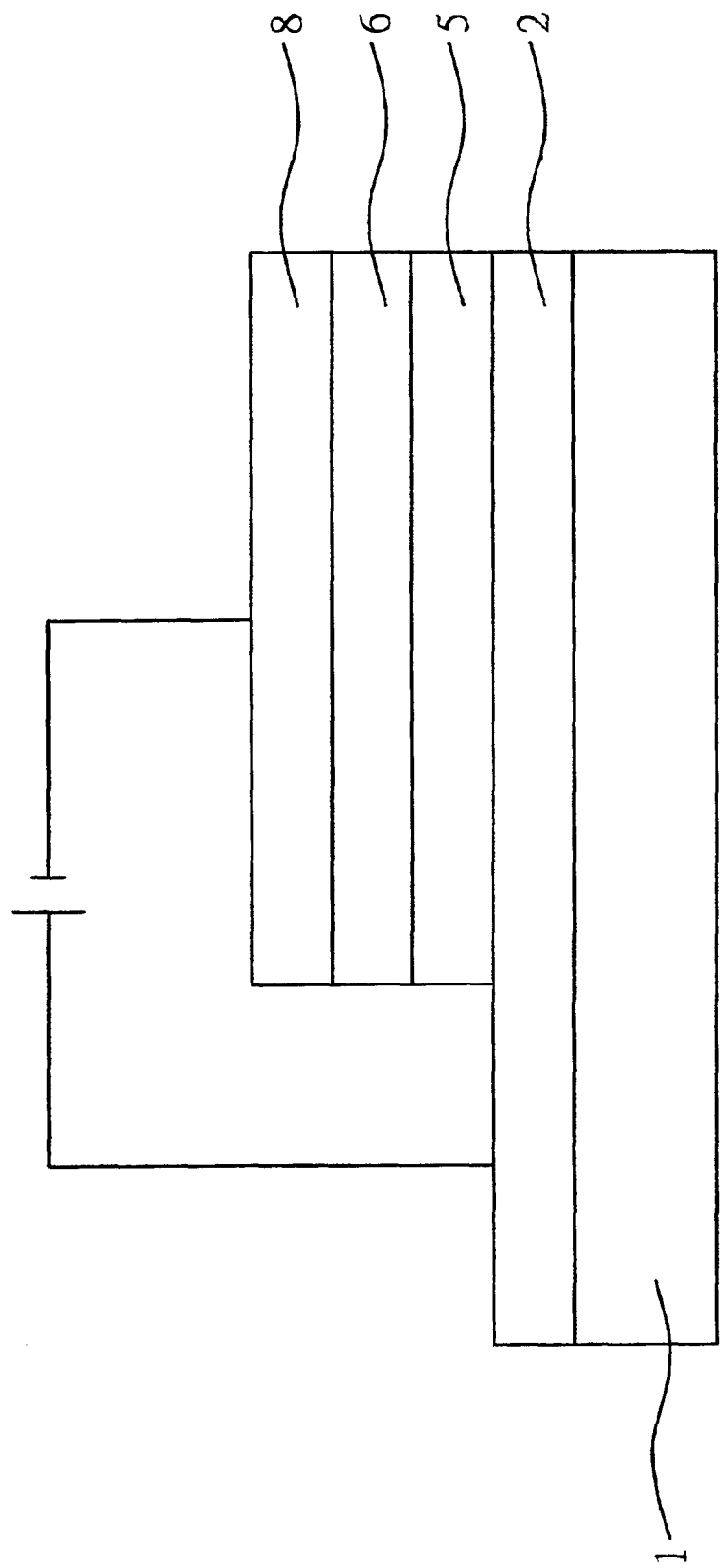
PRIOR ART FIG.1

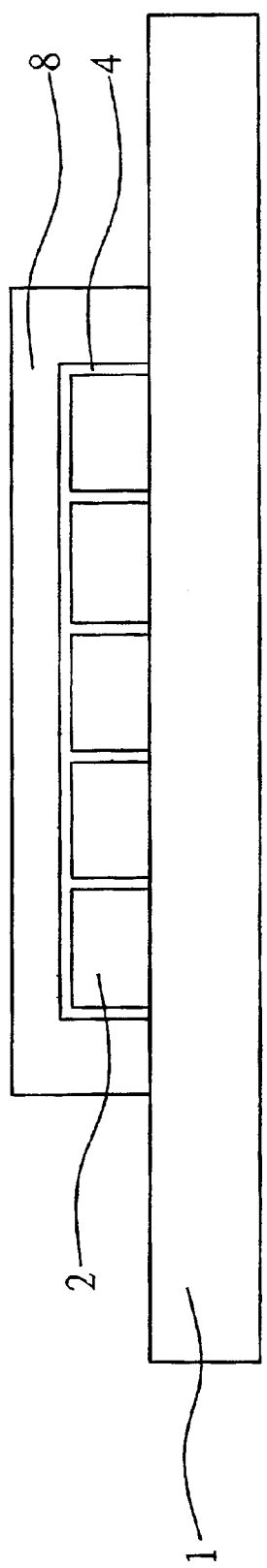
PRIOR ART FIG. 2

PHOTOSENSITIVE INSULATING FILM OF ORGANIC LIGHT EMITTING DIODE (OLED)

FIELD OF INVENTION

A photosensitive insulating film of the present invention can be applied to an OLED, wherein it utilizes the light emitting semiconductor device to emit light when a potential is employed, and it belongs to an electroluminescent (EL) field, and is a brand-new displaying technique in the present. The organic film material used in an electroluminescent device can be a molecule-based device and a polymer-based device.

BACKGROUND OF INVENTION

Recently, the electronic products grow up rapidly, for the higher requirements of a flat-panel display the conventional cathode ray tube (CRT) display can not meet the market demands. A light, thin, saved electricity, and high pixel flat-panel display will become a main stream in the future display. A thin film transistor liquid crystal display (TFT-LCD) industry is developing vigorously, since the production cost is still very high, and the pixel quality and reaction rate functions still need to be promoted, many research institutes devote to developing a new generation flat-panel display, and an OLED possesses advantages such as self-emitting light, speed reaction, wide view-angle, high resolution, high brightness, etc. be viewed as a brand-new applied technique for display. Advantages of OLED are without a back light source, a self-emitting light, a simple structure, and no view-angle limit. The principle of organic electroluminescent display is to employ an electroluminescent device, when a potential is applied in the presence of an electrical field, an electron and a hole moves from anode and cathode, respectively, then recombine together in an emitting-light layer to form an excition, afterwards, the energy releases in terms of irradiation. In general, an OLED structure is shown as in FIG. 1, wherein on a glass substrate it sequentially forms an ITO transparent electrode, an organic light-emitting layer (usually the combination of a hole-transport layer and a light-emitting layer), and a conductive layer.

FIG. 2 illustrates when an organic light-emitting layer forms in a convex ITO transparent electrode area, its thickness is much thinner than that of a transparent electrode, hence it breaks down very easily to cause a signal lost or weaken; especially when the convex edge of a convex ITO transparent electrode is a sharp shape, it easily results from a signal lost or weaken.

In order to avoid causing the said of situation hence an idea to employ an insulating film between two electrodes was demonstrated in some references. U.S. Pat. No. 5,994, 836 employs a negative photoresist to be as an insulating film, wherein the smoothness and an inclining angle of transparent electrode will be an important effect to influence the yields. Formation of an inclining angle for a negative photoresist is controlled by the fabrication conditions such as an exposing energy, a developing time, and a concentration of developing solution, the fabrication controlled conditions and the control of the film thickness must be very careful, otherwise it easily causes an excessive exposure to result from a larger inclining angle or a photoresist residual. U.S. Pat. No. 6,222,315 employs a polyimide (PI) resin to be as an insulating film, wherein it employs a photoresist coated on a PI film and utilizes a photolithography technique to obtain a photoresist be formed a mask, then etches PI film by way of controlling etching time and the concentration of an etching solution to control an inclining angle. The inclining angle is easily controlled, but it needs somemore annoying steps in the fabrication.

SUMMARY OF THE INVENTION

Hence, the aim of this invention is to solve the drawbacks described above. In order to avoid the presence of the drawbacks described above, the present invention is to provide a photosensitive insulating film employed onto an OLED device, wherein it provides an easily formed inclining angle, smooth surface, and fabrication conditions be easily controlled positive insulating film photoresist, and covers the edge of transparent electrode (anode) to avoid the breakdown or interference with conductive layer (cathode) and to increase the yields of production.

In order to obtain the aim described above, the present invention provides a positive photoresist to be as an insulating film, wherein its exposed area is a developed area, and a non-exposed area is a non-developed area, since molecules of the formulation composition are still molecule-based after developing, it possesses a reflow effect during a period of postbaking, naturally the insulating film possesses an inclining angle and smooth surface effect with transparent electrode as well as glass substrate due to the insulating film itself has a surface tension, then it cooks to obtain a polymer more relatively tolerant, therefore, the insulating film can cover the edge of transparent electrode (anode) to avoid the breakdown of an organic light-emitting layer film to result from signal lost or weaken when the edge of an ITO transparent electrode is a sharp shape. A positive photoresist insulating film of the present invention forms between a substrate and a conductive layer, and employs the exposing and developing method to remove a plurality of insulating film on the central portion of transparent electrode (but the edge portion of transparent electrode 2 is still covered by an insulating film), and forms a plurality of insulating film layers between cavity and insulating convex, the bottom of cavity is a transparent electrode (anode), two walls of cavity are the insulating film material; the convex top face is a smooth convex ball face shape, and its convex angle is an inclining obtuse angle, it becomes a gradient smooth and gradually widening shape from the top face to the bottom face.

BRIEF DESCRIPTION OF THE DRAWINGS

FIG. 1 illustrates the conventional OLED structure.

FIG. 2 illustrates the conventional organic light emitting layer forms on the convex ITO transparent electrode surface.

DETAILED DESCRIPTION OF THE PREFERRED EMBODIMENTS

Figure 3A:
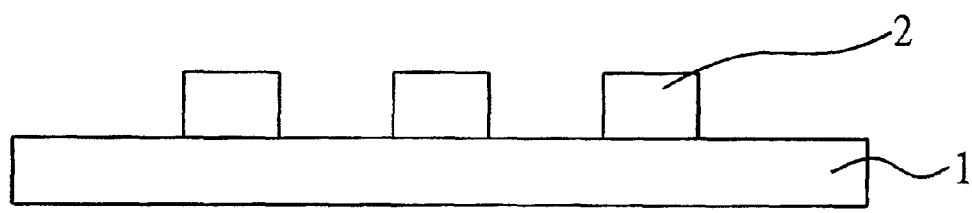
FIGS. 3A~3E illustrate the structural fabrication flow charts of OLED for the present invention.

The present invention provides a photosensitive insulating film of OLED, wherein an OLED comprises of a Substrate 1, a plurality of transparent electrodes 2 on a Substrate 1, a positive photoresist insulating film layer 3, an organic light-emitting layer 4 (hole-transport layer 6 and light-emitting layer 7), an electron-transport layer 8, and a conductive layer 9. When a suitable potential is applied onto an electrode, it utilizes a positive photoresist insulating film 3 to cover the edges of a plurality of transparent electrodes 2 to avoid the breakdown of an organic light-emitting layer film to result from signal lost or weaken due to the sharp shape of transparent electrode 2, and to emit the visible light from an organic light-emitting layer 4, and to increase the yields of device fabrication.

As illustrated in FIG. 3A it provides a Substrate 1, wherein the Substrate 1 can be a glass-based material or a plastic-based material, a glass-based material has a higher reliability since it has high hardness, better insulating capability for water vapor and oxygen gas; a plastic-based material possesses the flexibility, lighter weight, and a suitable device life when a suitable insulating layer under increasing water vapor and oxygen gas. On a Substrate 1 it forms a plurality of transparent electrodes 2 be viewed as an anode of its OLED, a plurality of transparent electrodes 2 are convex transparent electrodes 2 formed onto its Substrate 1 in ordered arrangement with an appropriate distance between a plurality of convex transparent electrodes 2, the usual transparent electrode 2 material can be selected from indium-tin-oxide (ITO), indium-zinc-oxide (IZO), etc.

Figure 3B:
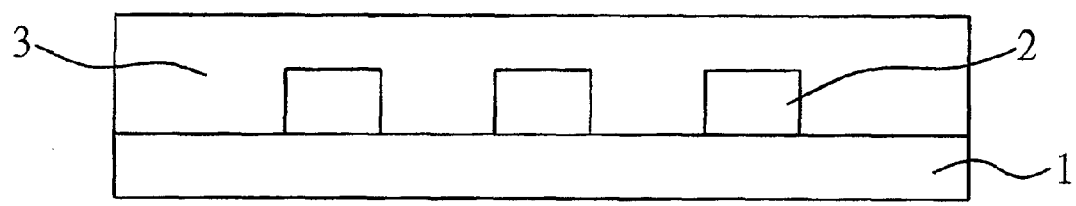
Figure 3C:
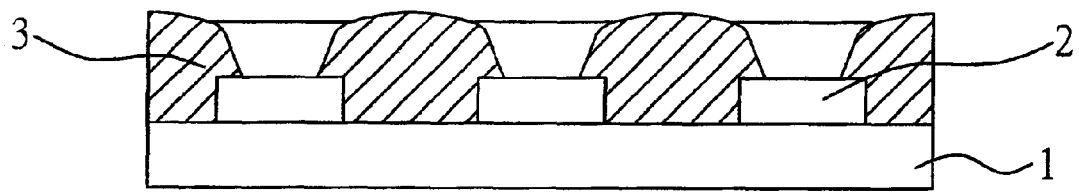

As illustrated in FIG. 3B a positive photoresist insulating film 3 is coated onto a Substrate 1 and a transparent electrode 2, the thickness range of an insulating film layer is 50~5000 nm, and the materials of insulating film layer are positive photoresist phenolic resin, naphthoquinone diazide photoactive compound (PAC), and thermosetting resin. As illustrated in FIG. 3C for a positive photoresist insulating film 3 its exposed area is a developed area and a non-exposed area is a non-developed area, since molecules of the formulation composition are still molecule-based after developing, it possesses a reflow effect during a period of postbaking, naturally the insulating film possesses an inclining angle and smooth surface effect with transparent electrode 2 as well as a Substrate 1 due to the insulating film itself has a surface tension; and employs the baking, exposing and developing method to remove a plurality of insulating film 3 on the central portion of transparent electrode 2 (but the edge portion of transparent electrode 2 is still covered by an insulating film), and forms a plurality of insulating film layers 3 between cavity and insulating convex, the bottom of cavity is a transparent electrode 2, two walls of cavity are the insulating film 3; the convex top face is a smooth convex ball face shape, and its convex angle is an inclining obtuse angle, it becomes a gradient smooth and gradually widening shape from the top face to the bottom face.

Figure 3D:
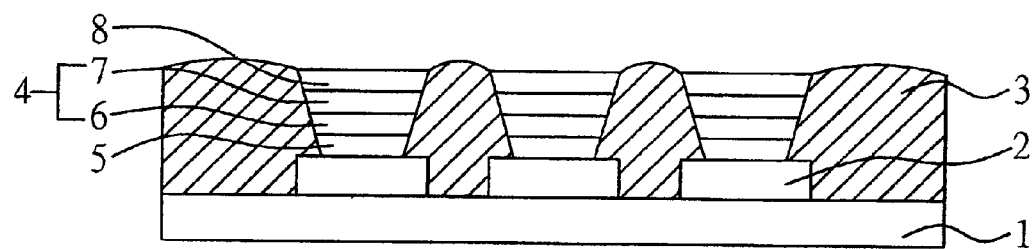

An organic light-emitting layer 4 is usually composed of a hole-transport layer 6 and a light-emitting 7, if it promotes the device efficiency in addition to a hole-transport layer 6 and a light emitting layer 7, it can add other organic layers including an electron-injection layer 5 and an electron-transport layer 8; in general, according to the need in a light-emitting layer 7 it can select suitable dopants and light-emitting host material to emit blue light, green light, red light, or white light. As illustrated in FIG. 3D on the transparent electrode 2 in its cavity it forms a hole-injection layer 5 by use of an evaporation method; the material of a hole-injection layer 5 can be selected from CuPc (copper phthalocyanine), MTDATA, 2-TNATA, etc.; then a hole-transport layer 6 is evaporated on a hole-injection layer 5, the material of a hole-transport layer 6 can be selected from TAPC, TPD, NPB, spiro-NPB, spiro-TAD, etc.; on the hole-transport layer 6 in the cavity it sequentially forms a light-emitting layer 7 and an electron-transport layer 8. The usual light-emitting host material can be selected from Alq3, Almq3, BeBq2, DPVBi, TPBI, etc., dopants material can be selected from Perylene, BczVBi, Coumarin 6, Counarin 545T, Rubrene, DCM, DCJTB, etc.; the material of usual electron-transport layer 8 can be selected from Alq3, PBD, TAZ, TPBI, etc.

Figure 3E:
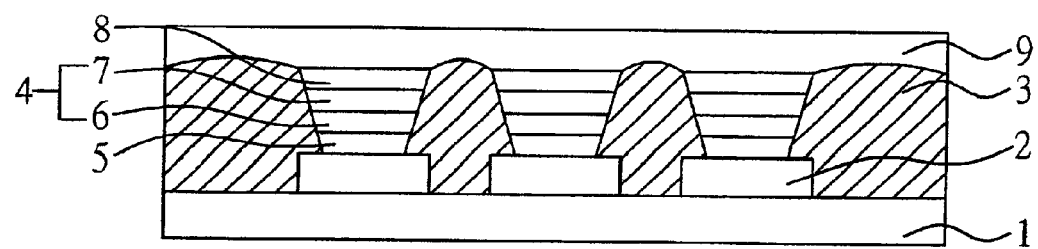

As illustrated in FIG. 3E on an electron-transport layer 8 and an insulating film layer it forms a conductive layer 9, which is located on the top layer of an OLED structure, and is parallel to the Substrate 1, the material can be Al, Ca, Mg, Li, and its alloy.

More detail description about positive insulating film, the composition includes phenolic resin, photoactive compound, thermosetting resin, and/or catalyst, solvent, and/or other adhesive promoter.

The phenolic resin component of the composition of the invention is a film-forming resin having phenolic hydroxyl groups that permit development of the composition in an aqueous alkaline developer. Phenolic resins are well known in the art. Exemplary phenolic resins include,for ememple, phenol aldehyde condensates known as the novolake resins, homo and copolymers of alkenyl phenols. Novolake resins are the thermoplastics condensation product of a phenol and an aldehyde. Example of suitable phenols for condensation with an aldehyde, especially formaldehyde, for the formation of novolak resins, include phenol; m-cresol; p-cresol; 2,4-xylenol; 2,5-xylenol; 3,4-xylenol; 3,5-xylenol; thymol and mixtures thereof. An acid catalyzed condensation reaction result in the formation of a suitable novolake resin that may vary in molecular weight from about 500 to 100000 daltons. The preferred novolake resins are the cresol formaldehyde condensation products. Poly (vinyl phenol) resins may be formed by block polymerization, emulsion polymerization or solution polymerization of corresponding monomers in the presence of a suitable catalyst. The photoactive o-quinone diazide sulfonic acid esters used in the photoresists of this invention The preferred materials are substituted naphthoquinone diazide sulfonic acid esters conventionally used for the formation of positive working photoresists. The more preferred photoactive compounds are naphthoquinone-(1,2)-diazide-5-sulfonyl chloride and naphthoquinone-(1,2)-diazide-4-sulfonyl chloride condensed with a phenolic compound. The most preferred photoactive compounds are naphthoquinone-(1,2)-diazide-5-sulfonyl chloride condensed with a trihydroxybenzophenone and most preferably, condensed with the product of reduction of a trihydroxybenzophenone.

The themosetting resin could be chose from Melamine-formaldehyde resins, benzoguanamine formaldehyde resins and glycoluril-formaldehyde resins. The melamine formaldehyde resins are amino resins formed by condensation of formaldehyde with melamine. The resins are typically ethers such as trialkylol melamine and hexalkylol melamine. The alkyl group may have from 1 to as many as 8 or more carbon atoms but is preferably methyl. Dependent upon the reaction conditions and the concentration of formaldehyde, the methyl ethers may react with each other to form more complex units. The suitable melamine-formaldehyde resins could be chose from Cymel 300, Cymel 301, Cymel 303, Cymel 350, Cymel 323, Cymel 325, Cymel 327, Cymel 373, Cymel 380, Cymel 385, Cymel 1116, Cymel 1130, Cymel 1133, Cymel 1168, Cymel 1156 (American Cyanamid Company).

The melamine resins are known in the art, commercially available from American Cyanamid Company of Wayne, N.J. under the trade name Cymel and described in American Cyanamid's product bulletin High Solids Amino Cross-linking Agents. In accordance with this invention, the preferred melamine formaldehyde resins has a degree of polymerization varying between 1.3 and 2.0 and most I preferably, us a member of the Cymel 300 resin series which are highly methylated melamine formaldehyde resins. The most preferred melamine formaldehyde resin for purposes of this invention is Cymel 301, which is a hexamethoxymethyl melamine with a low methylol content having alkoxy groups as the principle reactive groups and a degree of polymerization of 1.5.

The benzoguanamine formaldehyde resins could be chose from Cymel 1123 (American Cyanamid Company). The glycoluril-formaldehyde could be chose from Cymel 1170, Cymel 1171, Cymel 1172 (American Cyanamid Company).

In addition to the binder, photoactive compound and cross-linking agent, as should be apparent to those skilled in the art, other additives may be included in the photoresist formulation. For example, other resins may be added to the photoresist such as epoxy resins and vinyl polymers, such as polyvinyl acetates, polyacrylates, polyvinyl acetates, polyvinyl ethers, polyvinyl pyrrolidones and co-polymers of the monomers on which these materials are based, as well as hydrogenated or partially hydrogenated colophony derivatives.

In accordance with one embodiment of the invention, the photoresist is in the form of a liquid coating composition. The coating composition is formed by dissolving the photoresist components in a suitable solvent. The selection of the solvent should be matched to the coating process to be used, the desired thickness of the photoresist layer and drying condition. Suitable solvents for the composition of the present invention include ketones such as methylethyl ketones; chlorinated hydrocarbons, such as trichloroethylene and 1,1,1-tricholoroethane; alcohols, such as n-propanol ethers such as tetrahydrofuran; alcohol-ethers, such as ethylene glycol monomethyl ether; and alcohol-ether acetates, such as ethylene glycol monoethyl ether acetate and propylene glycol monomethyl ether acetate. Preferred for purposes of this invention are the ether acetates of glycols, especially propylene glycol monomethyl ether acetate.

A photoresist coating composition is formed by dissolving the above identified photoresist components in one or more of the aforesaid solvents. The total solvents content of the photoresist composition should vary between 60 and 88 percent by weight and more preferably, between 70 and 80 percent by weight. Of the solids, the binder (resin) should comprise from about 30 to 90 percent by weight of the total solids content, and more preferably, from about 55 to 85 percent of the solids; the photoactive compound should comprise from about 8 to 32 percent of the total solids and more preferably, from 17 to 27 percent of the solids content, and the cross-linking agent should comprise from about 2 to 18 percent of the total solids content, and more preferably, from about 5 to 14 percent of the solids. Other additives would be used in their conventional concentration.

EXAMPLE 1

Formulation and Process for a Positive Photoresist Insulating Film

| Formulation for a Positive Photoresist Insulating Film | Composition (grams) |
| --- | --- |
| Phenolic Resin | 20 |
| Photoactive Compound (PAC) | 4 |
| Cymel 301 | 2 |
| GPTS (glycidoxy propyl trimethoxysilane) | 1 |
| Solvent (ethyl lactate) | 150~700 |

Note:
Adjust the fixed content amounts and spin-coating rate to obtain the required thickness of the film.

Fabrication Process
1. On an ITO glass substrate 1 by way of a photoresist photolithography technique it etches ITO circuit firstly.
2. Wash the substrate 1 and dry it.
3. It is coated by a positive photoresist insulating film with different thickness, the film thickness is 2000~10000 Å.
4. Bake it at 100° C. for 3 min., it is exposed with 100 MJ, TMAH 2.38%, and developed for 60 seconds, a square ITO glass is manifested, and baked at 250° C. for 1 hr.
5. Wash the substrate 1.
6. Copper phthalocyanine (CuPc) as the material of a hole-injection layer 5 (150 Å) is evaporated onto an ITO glass.
7. The material of a hole-transport layer 6 (500 Å), N, N'-bis-1-naphthyl)-N,N'-diphenylbenzidine (NPB), is evaporated onto a hole-injection layer 5.
8. The aluminum complex of a light-emitting layer 7(200 Å), aluminum-tris-8-hydroxyquinoline (Alq3), is evaporated onto a hole-transport layer 6.
9. The aluminum complex of an electron-injection layer, aluminum-tris-8-hydroxyquinoline (Alq3), is evaporated onto a light-emitting layer 7.
10. LiF/Al is evaporated onto an electron transport layer 8 be viewed as a cathode.
11. The device is packaged in the dry box, which is full of nitrogen gas.
12. Panel plate test.

EXAMPLE 2

Compared Example

Formulation and Process for a Negative Photoresist Insulating Film

| Formulation for a Negative Photoresist Insulating Film | Composition (grams) |
| --- | --- |
| Binder (Novolak epoxy acrylate, COOH: 0.65) | 100/153 |
| M400 | 20 |
| 907 | 10 |
| GPTS (glycidoxy propyl trimethoxysilane) | 5 |
| Solvent (ethyl lactate) | 180~500 |

Note:
Adjust the fixed content amounts and spin-coating rate to obtain the required thickness of the film.

Fabrication Process
1. On an ITO glass substrate 1 by way of a photoresist photolithography technique it etches ITO circuit firstly.
2. Wash the substrate 1 and dry it.
3. It is coated by a negative photoresist insulating film with different thickness, the film thickness is 2000~10000 Å.
4. Bake it at 100° C. for 3 min., it is exposed with 500 MJ, $Na_2CO_3$ 1%, and developed for 10 seconds, a square ITO glass is manifested, and baked at 250° C. for 1 hr.

5. Wash the substrate 1.
6. Copper phthalocyanine (CuPc) as the material of a hole injection layer 5 (150 Å) is evaporated onto an ITO glass.
7. The material of a hole-transport layer 6 (500 1Å), N,N'-bis-1-naphthyl)-N,N'-diphenylbenzidine (NPB), is evaporated onto a hole-injection layer 5.
8. The aluminum complex of a light-emitting layer 7 (200 Å), aluminum-tris-8-hydroxyquinoline (Alq3), is evaporated onto a hole-transport layer 6.
9. The aluminum complex of an electron-injection layer, aluminum-tris-8-hydroxyquinoline (Alq3), is evaporated onto a light-emitting layer 7.
10. LiF/Al is evaporated onto an electron transport layer 8 be viewed as a cathode.
11. The device is packaged in the dry box, which is full of nitrogen gas.
12. Panel plate test; the brightness examination with an electrical power.

| Film Thickness (Å) | Positive Photoresist | Negative Photoresist |
|---|---|---|
| 2000 | OK | OK |
| 3000 | OK | OK |
| 4000 | OK | A little of breakdown |
| 6000 | OK | Breakdown |
| 10000 | OK | Breakdown |

The present invention specially discloses and describes selected the best examples. It is to be understood, however, that this invention is not limited to the specific features shown and described. The invention is claimed in any forms or modifications within the spirit and the scope of the appended claims.

What is claimed is:

1. A luminous device comprised of: a substrate;
   a plurality of transparent electrodes, in which a plurality of convex transparent electrodes are formed onto the substrate in ordered arrangement with an appropriate distance between each other, each electrode having an edge portion;
   a conductive layer, which is located on the top layer of the luminous device and parallel to the substrate;
   a plurality of insulating film layers wherein said plurality of insulating film layers are arranged to cover said edge portions of said electrodes and said plurality of insulating film layers are arranged to define a cavity above each electrode wherein each cavity has a bottom portion defined by said electrode and each cavity has two side portions defined by side portions of adjacent insulating film layers; and each insulating film layer has an upper convex portion;
   a hole-transport layer, on a hole-injection layer in an insulating film cavity;
   a light-emitting layer, on the hole-transport layer in an insulating film cavity; and
   an electron-transport layer, on the light-emitting layer in an insulating film cavity.

2. A luminous device of claim 1 wherein said the substrate is glass or a plastic film.

3. A luminous device of claim 1 wherein the thickness range of the insulating film layer is 50~5000 nm for a positive photoresist insulating film, and the composition of the insulating film includes phenolic resin, photoactive compound, thermosetting resin, catalyst, solvent, and an adhesive promoter.

4. A luminous device of claim 3 wherein the insulating positive photo resist film has a convex top face with a smooth convex ball face shape, and its convex angle is an inclining obtuse angle, forming a smooth gradient and gradually widening shape from the top face to a bottom face.

5. A luminous device of claim 3 wherein the insulating convex shape results from a method of postbake heated reflow.

6. A luminous device of claim 1 wherein said the material of a plurality of transparent electrodes can be selected from the group consisting of indium-tin-oxide (ITO) and indium-zinc-oxide (IZO).

7. A luminous device of claim 1 wherein said the material of the conductive layer is selected from the grouping consisting of Al, Ca, Mg, Li, and lithium alloy.

8. A luminous device of claim 3 wherein said thermosetting resin is selected from the group consisting of melamine formaldehyde resins, benzoguanamine formaldehyde resins, and glycoluril formaldehyde resins.

9. A luminous device of claim 3 wherein said catalyst is acidic or is acidifiable.

* * * * *